US010181501B2

(12) United States Patent
Chen

(10) Patent No.: US 10,181,501 B2
(45) Date of Patent: Jan. 15, 2019

(54) MICRO LIGHT-EMITTING DIODE DISPLAY PANEL

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/983,106

(22) Filed: May 18, 2018

(65) Prior Publication Data

US 2018/0269264 A1 Sep. 20, 2018

Related U.S. Application Data

(63) Continuation of application No. 15/116,222, filed on Aug. 3, 2016, now Pat. No. 10,002,915.

(30) Foreign Application Priority Data

Jun. 22, 2016 (CN) .......................... 2016 1 0458152

(51) Int. Cl.
| | |
|---|---|
| H01L 27/32 | (2006.01) |
| G09G 3/3208 | (2016.01) |
| G09F 9/302 | (2006.01) |
| G09F 9/33 | (2006.01) |
| G09G 3/32 | (2016.01) |
| H01L 25/075 | (2006.01) |
| H01L 27/15 | (2006.01) |
| H01L 33/20 | (2010.01) |

(52) U.S. Cl.
CPC ............ *H01L 27/326* (2013.01); *G09F 9/302* (2013.01); *G09F 9/33* (2013.01); *G09G 3/32* (2013.01); *G09G 3/3208* (2013.01); *H01L 25/075* (2013.01); *H01L 25/0753* (2013.01); *H01L 27/153* (2013.01); *H01L 27/156* (2013.01); *H01L 27/3206* (2013.01); *H01L 33/20* (2013.01)

(58) Field of Classification Search
None
See application file for complete search history.

(56) References Cited

U.S. PATENT DOCUMENTS

| | | | |
|---|---|---|---|
| 9,570,427 B2* | 2/2017 | Bibl | ........................ H01L 33/44 |
| 9,698,160 B2* | 7/2017 | Wu | ..................... H01L 21/6835 |
| 2012/0092389 A1* | 4/2012 | Okuyama | ................. G09F 9/33 |
| | | | 345/690 |

* cited by examiner

*Primary Examiner* — Minh-Loan Tran
(74) *Attorney, Agent, or Firm* — Leong C. Lei

(57) ABSTRACT

A micro LED display panel includes a plurality of active areas disposed on a substrate and arranged in an array. A plurality of micro LEDs are uniformly arranged in each of the active areas to achieve high-resolution of micro LED display panel. By controlling the number of micro LEDs in each of the active areas, the production cost can be effectively controlled, while a screen door effect can be eliminated to thereby enhance market competitiveness of the micro LED display panel.

9 Claims, 4 Drawing Sheets

MICRO LIGHT-EMITTING DIODE DISPLAY PANEL

CROSS REFERENCE TO RELATED APPLICATIONS

This is a continuation application of co-pending U.S. patent application Ser. No. 15/116,222, filed on Aug. 3, 2016, which is a national stage of PCT Application No. PCT/CN2016/090114, filed on Jul. 15, 2016, claiming foreign priority of Chinese Patent Application No. 201610458152.5, filed on Jun. 22, 2016.

BACKGROUND OF THE INVENTION

1. Field of the Invention

The present invention relates to the field of display, and in particular to a micro light-emitting diode (micro LED, μLED) display panel

2. The Related Arts

The panel display device, due to the advantages of high display quality, low power-consumption, thin size and wide application, is widely used in mobile phones, TV, PDA, digital camera, notebook PC, desktop PC, and so on, and becomes the mainstream technology.

The micro LED display device is a display device which utilizes high density micro-scaled LED array integrated on a substrate as display pixels to achieve image display. Similar to a larger-scaled outdoor LED display, each pixel is addressable and individually driven to emit light, and can be viewed as a reduce-sized outdoor LED display by reducing the inter-pixel distance from cm scale to mm scale. Micro LED display device and the organic light-emitting diode (OLED) are both self-luminous, but the micro LED shows the advantages of higher material stability, longer lifespan and no image imprinting as compared to the OLED, and is considered as the major competing technology for OLED display device.

Because of lattice match, micro LED element must be grown on a sapphire-based substrate by molecular beam epitaxy (MBE) method. To manufacture a display panel, the micro LED element must be transferred from the sapphire-based substrate to the receiving substrate for forming the display panel. The micro transfer printing (MTP) is a technology to transfer the micro LED element grown on the sapphire-based substrate to the receiving substrate. Specifically, a laser lift-off (LLO) technology is used to separate the micro LED bare chip from the sapphire-based substrate, and then a patterned polydimethylsiloxane (PDMS) transfer stamp is used to adsorb to the micro LED bare chip off from the sapphire-based substrate, the PDMS transfer stamp is aligned with the receiving substrate for positioning, and then the micro LED bare chip adsorbed by the PDMS transfer stamp is attached to the pre-set position on the receiving substrate, and then the PDMS transfer stamp is peeled off to accomplish micro LED bare chip transfer to form micro LED array substrate. Moreover, the receiving substrate is silicon substrate already prepared with circuit pattern, which may be rigid or flexible.

At present, the size of the sub-pixel in the flat panel display, such as, LCD panels is relatively large for the micro LED. If a micro LED is used to fill the position of the area equivalent of the existing sub-pixel area, a greater gap will appear between the sub-pixel areas, resulting in the screen door effect. In other words, the display will seem covered with a black mesh overlay on the image, similar to viewing through the screen door. To solve the screen door effect, an approach is to fill the area of the space equivalent to the existing sub-pixel with a plurality of micro LEDs. However, this approach requires a large number of micro LEDs, resulting in high costs.

SUMMARY OF THE INVENTION

The object of the present invention is to provide a micro LED display panel, able to achieve high resolution of micro LED display panel, eliminate screen door effect and reduce manufacturing cost.

To achieve the above object, the present invention provides a micro LED display panel, which comprises: a substrate, and a plurality of active areas disposed on the substrate and arranged in an array, with each active area disposed with a plurality of micro LEDs uniformly distributed with intervals.

Each active area is rectangular.

Each of the active areas belonging to an odd-numbered column, odd-numbered row and the active areas belonging to an even-numbered column, even-numbered row comprises five micro LEDs, with four disposed at the four corners of the active area and one disposed at the center of the active area; each of the active areas belonging to an odd-numbered column, even-numbered row and the active areas belonging to an even-numbered column, odd-numbered row comprises four micro LEDs, with four disposed respectively at the mid-point of four sides of the active area.

The micro LEDs in the active areas of the same row have the same light color, and the micro LEDs in the two neighboring active areas have different light colors.

For a positive integer M, the light color of the micro LEDs in the active areas of the (3M-2)-th row is red, the light color of the micro LEDs in the active areas of the (3M-1)-th row is green, and the light color of the micro LEDs in the active areas of the 3M-th row is blue.

Each active area comprises nine micro LEDs, arranged in a 3×3 array.

Two neighboring micro LEDs in the same active area have different light colors.

The light colors of the micro LEDs in the three rows of the first column of each active area are red, green and blue sequentially; the light colors of the micro LEDs in the three rows of the second column of each active area are green, red and blue sequentially; and the light colors of the micro LEDs in the three rows of the third column of each active area are blue, green and red sequentially.

Each active area is disposed with four micro LEDs, with the four micro LEDs disposed respectively at the mid-point of the four sides of the active area, wherein the two opposite sides have red micro LEDs at mid-point, and the remaining two opposite sides have a green micro LED and a blue micro LED respectively at mid-point.

The micro LED is manufactured by micro transfer printing.

The present invention also provides a micro LED display panel, which comprises: a substrate, and a plurality of active areas disposed on the substrate and arranged in an array, with each active area disposed with a plurality of micro LEDs uniformly distributed with intervals; wherein each active area being rectangular; and the micro LEDs being manufactured by micro transfer printing.

Compared to the known techniques, the present invention provides the following advantages: the present invention provides a micro LED display panel, by disposing a plurality of active areas on the substrate arranged in an array, and a plurality of micro LEDs uniformly arranged in each active area, to achieve high-resolution of micro LED display panel, and by controlling the number of micro LEDs in each active area to effectively control the production cost, while eliminating the screen door effect, to enhance market competitiveness of micro LED display panel.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Refer to FIGS. 1-4. The present invention provides a micro LED display panel, which comprises: a substrate 1, and a plurality of active areas 2 disposed on the substrate 1 and arranged in an array, with each active area 2 uniformly arranged with a plurality of micro LEDs 3 with intervals.

Specifically, the active area 2 is equivalent to a large pixel area. Compared to known technology, the large pixel area is neither filled with micro LEDs in the entire area, nor disposed with a single micro LED. Instead, a plurality of uniformly arranged micro LEDs is disposed in the large pixel area. Compared the filled pixel area, the present invention cost less due to less number of the micro LEDs. Compared to disposing a single micro LED, the present invention can effectively eliminate the screen door effect by uniformly arranging a plurality of micro LEDs. In other words, the present invention can ensure display quality (by eliminating screen door effect) while maintain reasonable cost to provide higher cost/performance value for market competitiveness.

Specifically, each active area is rectangular. The number of the micro LEDs 3, the arrangement and the light color combination can all vary to fit corresponding application. The following four embodiments describe four possible configurations.

Figure 1:
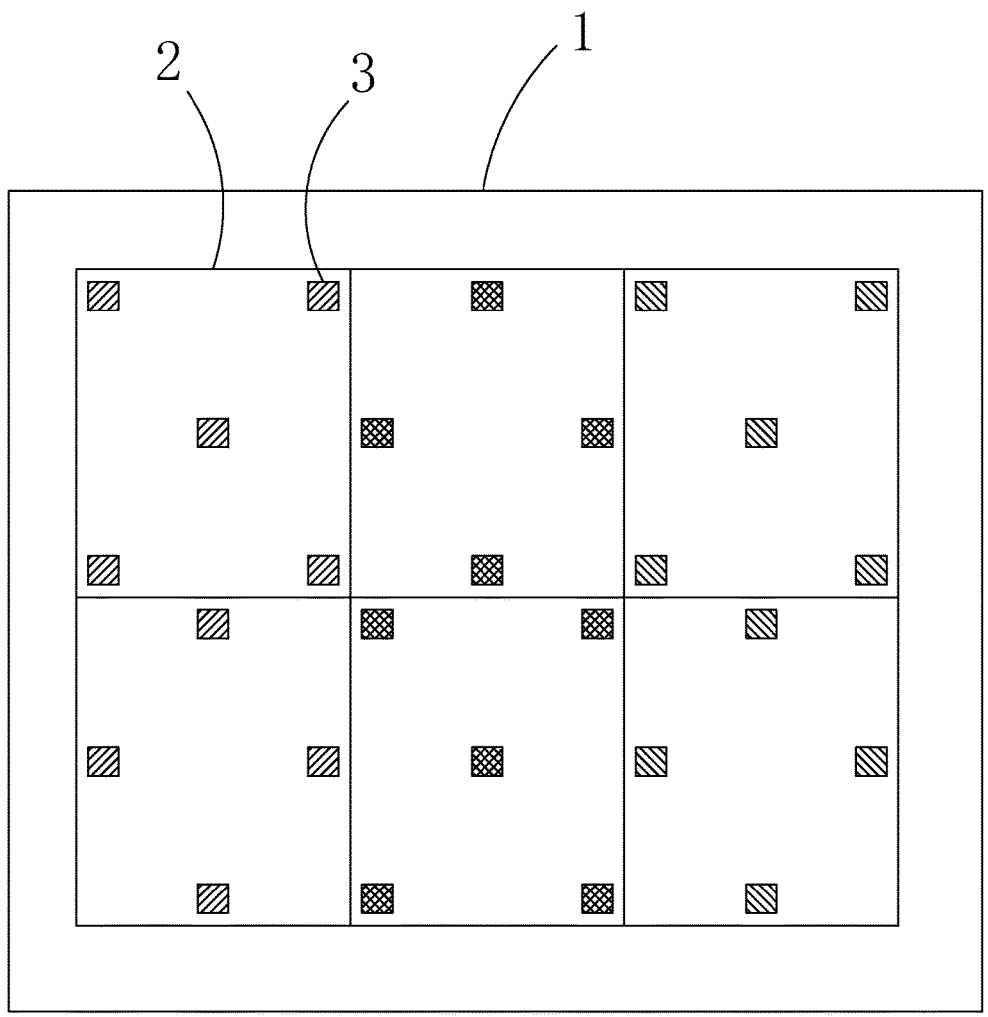
FIG. 1 is a schematic view showing the structure of micro LED display panel provided by a first embodiment of the present invention.

Refer to FIG. 1. In the first embodiment of the present invention, each of the active areas 2 belonging to an odd-numbered column, odd-numbered row and the active areas 2 belonging to an even-numbered column, even-numbered row comprises five micro LEDs 3, with four micro LEDs 3 disposed at the four corners of the active area 2 and the remaining one micro LED 3 disposed at the center of the active area 2. Each of the active areas 2 belonging to an odd-numbered column, even-numbered row and the active areas 2 belonging to an even-numbered column, odd-numbered row comprises four micro LEDs 3, with four disposed respectively at the mid-point of four sides of the active area 2.

Moreover, the micro LEDs 3 in the active areas 2 of the same row have the same light color, the micro LEDs 3 in the two neighboring active areas 2 have different light colors. In the first embodiment, three colors, RGB, are used for color display, wherein for a positive integer M, the light color of the micro LEDs 3 in the active areas 2 of the (3M-2)-th row is red, the light color of the micro LEDs 3 in the active areas 2 of the (3M-1)-th row is green, and the light color of the micro LEDs 3 in the active areas 2 of the 3M-th row is blue.

Figure 2:
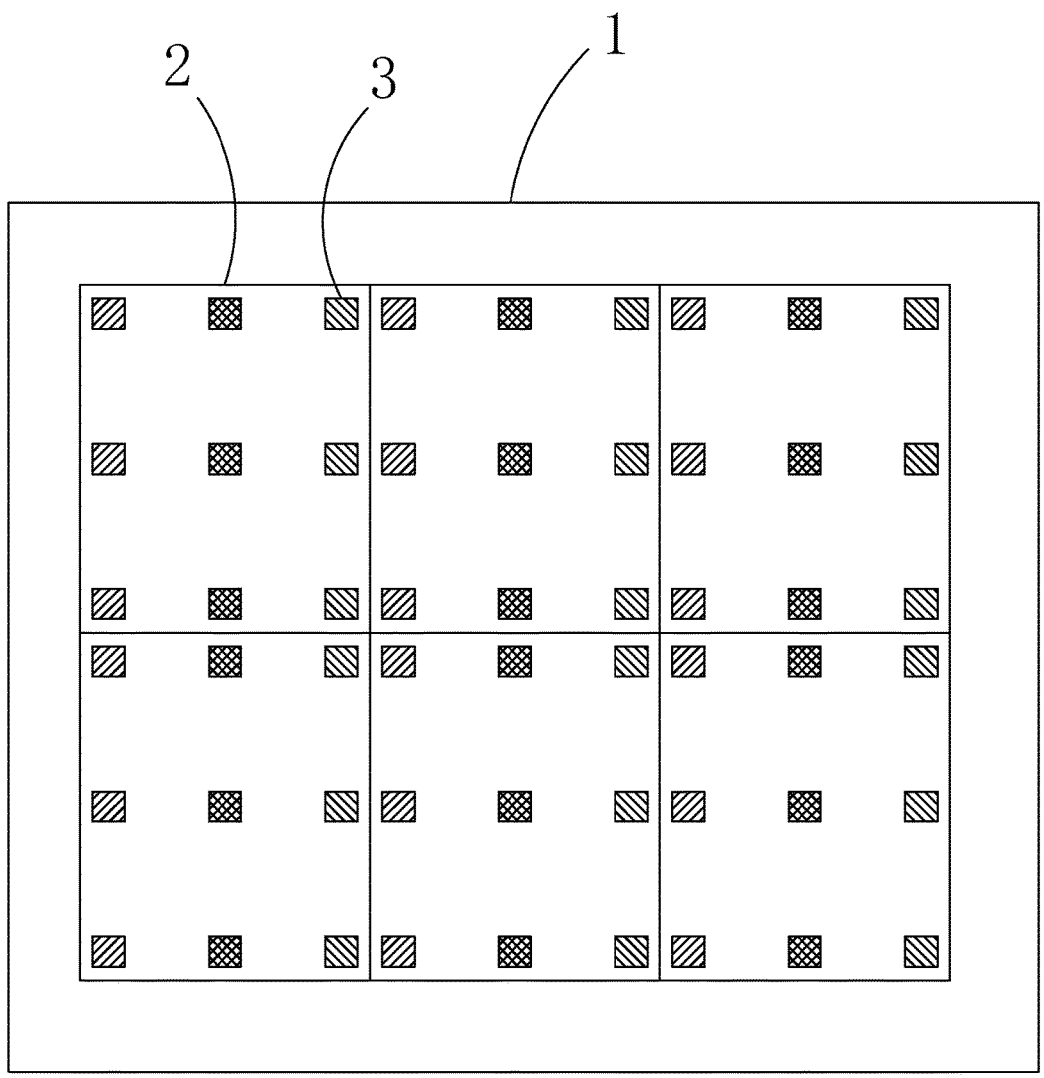
FIG. 2 is a schematic view showing the structure of micro LED display panel provided by a second embodiment of the present invention.

Refer to FIG. 2. In the second embodiment, each active area 2 comprises nine micro LEDs 3, arranged in an 3×3 array.

Moreover, the two neighboring micro LEDs 3 in the same active area 2 have different light colors. The light colors of the micro LEDs 3 in the three rows of the first column of each active area 2 are red, green and blue sequentially; the light colors of the micro LEDs 3 in the three rows of the second column of each active area 2 are green, red and blue sequentially; and the light colors of the micro LEDs 3 in the three rows of the third column of each active area 2 are blue, green and red sequentially.

It should be noted that light color arrangement sequence in the above embodiments is only exemplary, instead of restrictive. For example, in the first embodiment, the light color of the micro LEDs 3 in the active areas 2 of the (3M-2)-th row is green, the light color of the micro LEDs 3 in the active areas 2 of the (3M-1)-th row is red, and the light color of the micro LEDs 3 in the active areas 2 of the 3M-th row is blue. In the second embodiment, the light colors of the micro LEDs 3 in the three rows of the first column of each active area 2 are blue, green and red sequentially; the light colors of the micro LEDs 3 in the three rows of the second column of each active area 2 are green, red and blue sequentially; and the light colors of the micro LEDs 3 in the three rows of the third column of each active area 2 are red, blue and green sequentially. Furthermore, the micro LEDs 3 of all the active areas 2 are of the same color to form a monochrome micro LED display panel. Alternatively, the micro LEDs 3 of all the active areas 2 are of two different colors to form a dual-color micro LED display panel. Also, the light color of the micro LEDs 3 is not limited to red, green and blue. Other colors, such as, white or yellow, can also be used.

Figure 3:
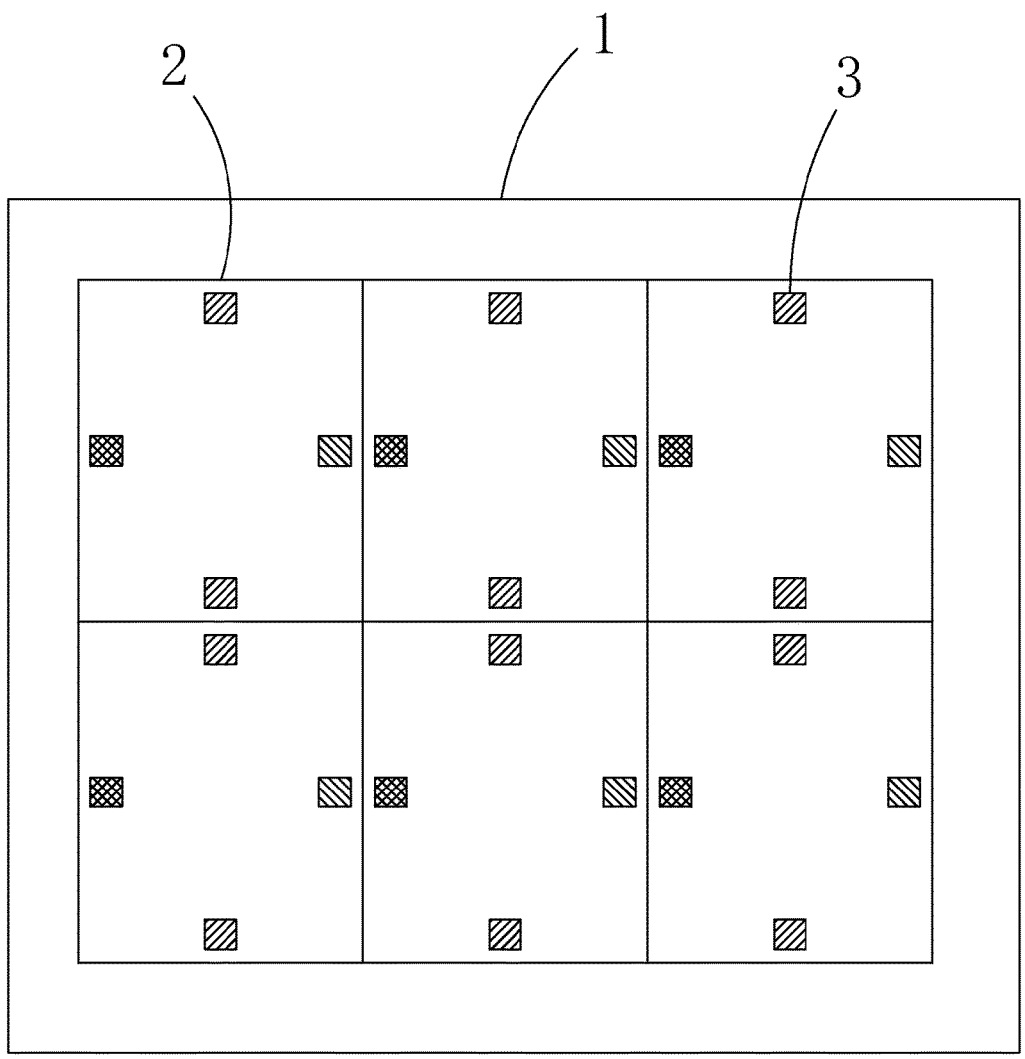
FIG. 3 is a schematic view showing the structure of micro LED display panel provided by a third embodiment of the present invention.
Figure 4:
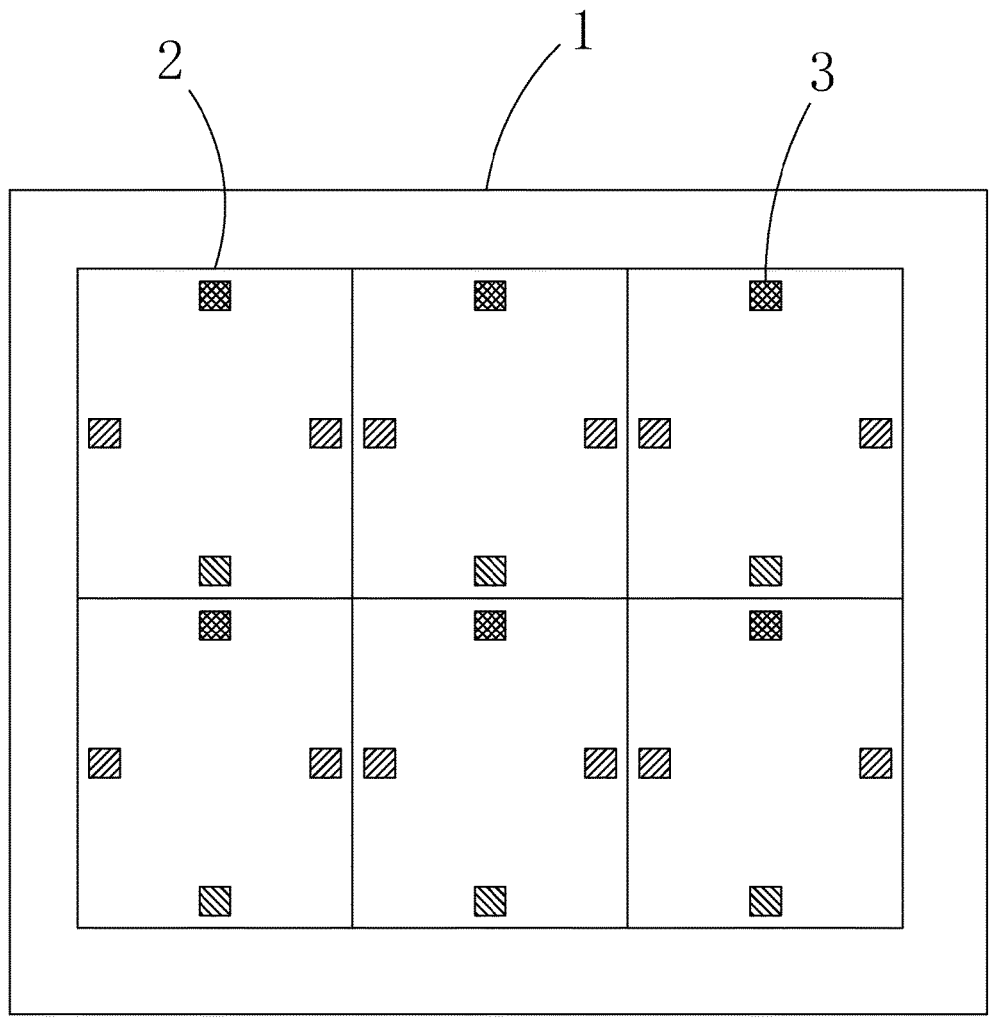
FIG. 4 is a schematic view showing the structure of micro LED display panel provided by a fourth embodiment of the present invention.

In addition, due to differences in luminous efficiency in the production of the different color micro LEDs, different arrangement ratios can be used in active area according to the application. In other words, different numbers of micro LEDs of different colors can be disposed in each active area, as shown in FIG. 3 and FIG. 4. In the third embodiment and the fourth embodiment of the present invention, each active area 2 is disposed with two red micro LEDs (whose luminous efficiency is lower compared to the green and blue LEDs), a green LED, and a blue LED. By adding more red LEDs, the low efficiency of red LEDs is compensated.

Refer to FIG. 3. Specifically, in the third embodiment, each active area 2 is disposed with four micro LEDs 3, with the four micro LEDs 3 disposed respectively at the mid-point of the four sides of the active area 2, wherein the two opposite sides (upper and lower) have red micro LEDs at mid-point, and the remaining two opposite sides (left and right) have a green micro LED and a blue micro LED respectively at mid-point. In the fourth embodiment, the two opposite sides (upper and lower) have a green micro LED and a blue micro LED respectively at mid-point, and the remaining two opposite sides (left and right) have red micro LEDs at mid-point.

It should be noted that the unequal arrangement is not restricted to the above third and fourth embodiments. Other combinations of number and layout arrangement can also be used depending on the application.

It should also be noted that the micro LED 3 is manufactured by micro transfer printing; specifically, by providing a native substrate, growing a plurality of micro LEDs 3 on the native substrate, and then using a MTP transfer stamp to transfer the plurality of micro LEDs 3 to the substrate 1.

In summary, the present invention provides a micro LED display panel, by disposing a plurality of active areas on the substrate arranged in an array, and a plurality of micro LEDs uniformly arranged in each active area, to achieve high-resolution of micro LED display panel, and by controlling the number of micro LEDs in each active area to effectively control the production cost, while eliminating the screen door effect, to enhance market competitiveness of micro LED display panel.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A micro light-emitting diode (LED) display panel, comprising:
a substrate; and
a plurality of active areas disposed on the substrate and arranged in an array, wherein each of the active areas comprises a plurality of micro LEDs distributed therein at intervals, the plurality of micro LEDs of each of the plurality of active areas being arranged in columns and rows, wherein the columns are arranged to extend in a column-wise direction and the rows are arranged to extend in a row-wise direction that is perpendicular to the column-wise direction, each of the columns comprising a first predetermined number of the micro LEDs, each of the rows comprising a second predetermined number of the micro LEDs;

wherein two adjacent ones of the columns of each of the plurality of active areas are arranged such that the micro LEDs of a first one of the two adjacent columns and the micro LEDs of a second one of the two adjacent columns are staggered with respect to each other in the column-wise direction; and two adjacent ones of the rows of each of the plurality of active areas are arranged such that the micro LEDs of a first one of the two adjacent rows and the micro LEDs of a second one of the two adjacent rows are staggered with respect to each other in the row-wise direction.

2. The micro LED display device as claimed in claim 1, wherein each of the plurality of active areas is a rectangle.

3. The micro LED display device as claimed in claim 2, wherein the plurality of active areas are arranged in columns and rows;
wherein each of the plurality of active areas belonging to an odd column and an odd row and each of the plurality of active areas belonging to an even column and an even row comprise five micro LEDs, four of which are disposed at four corners of the rectangle and a remaining one is disposed at a center of the rectangle;
wherein each of the plurality of active areas belonging to an odd column and an even row and each of the plurality of active areas belonging to an even column and an odd row comprise four micro LEDs respectively disposed at mid-points of four sides of the rectangle.

4. The micro LED display device as claimed in claim 3, wherein the micro LEDs in the active areas of the same row have the same light color, and the micro LEDs in two adjacent ones of the active areas have different light colors.

5. The micro LED display device as claimed in claim 4, wherein for a positive integer M, the light color of the micro LEDs in the active areas of the (3M-2)-th row is red; the light color of the micro LEDs in the active areas of the (3M-1)-th row is green; and the light color of the micro LEDs in the active areas of the 3M-th row is blue.

6. The micro LED display device as claimed in claim 2, wherein each of the plurality of active areas comprises four micro LEDs respectively disposed at mid-points of four sides of the rectangle.

7. The micro LED display device as claimed in claim 6, wherein the micro LEDs arranged at the mid-points of two opposite ones of the four sides of the rectangle are red micro LEDs and the micro LEDs arranged at the mid-points of the remaining two of the four sides of the rectangle are a green micro LED and a blue micro LED.

8. The micro LED display device as claimed in claim 1, wherein the first predetermined number of the first one of the two adjacent columns is different from the first predetermined number of the second one of the two adjacent columns.

9. The micro LED display device as claimed in claim 1, wherein the second predetermined number of the first one of the two adjacent rows is different from the second predetermined number of the second one of the two adjacent rows.

* * * * *